US012348201B2

(12) United States Patent
Singh

(10) Patent No.: US 12,348,201 B2
(45) Date of Patent: Jul. 1, 2025

(54) SQUELCH DETECTION DEVICE

(71) Applicant: STMicroelectronics International N.V., Geneva (CH)

(72) Inventor: Prashant Singh, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 663 days.

(21) Appl. No.: 17/565,288

(22) Filed: Dec. 29, 2021

(65) Prior Publication Data

US 2022/0123699 A1 Apr. 21, 2022

Related U.S. Application Data

(63) Continuation of application No. 16/746,518, filed on Jan. 17, 2020, now Pat. No. 11,233,488.
(60) Provisional application No. 62/809,368, filed on Feb. 22, 2019.

(51) Int. Cl.
*H03F 3/45* (2006.01)

(52) U.S. Cl.
CPC ............ *H03F 3/45179* (2013.01); *H03F 2203/45374* (2013.01); *H03F 2203/45424* (2013.01)

(58) Field of Classification Search
CPC ....... H03F 3/45179; H03F 2203/45374; H03F 2203/45424; H03F 1/26; H03F 1/32
USPC ........................................................ 330/261
See application file for complete search history.

(56) References Cited

U.S. PATENT DOCUMENTS

| | | | |
|---|---|---|---|
| 5,436,934 A * | 7/1995 | Co | H04B 1/1027 375/317 |
| 6,107,882 A | 8/2000 | Gabara et al. | |
| 7,586,336 B2 | 9/2009 | Blum | |
| 8,824,987 B2 | 9/2014 | Zhan | |
| 2002/0093381 A1 | 7/2002 | Taylor | |
| 2012/0015617 A1 | 1/2012 | Srivastava et al. | |
| 2012/0280721 A1 | 11/2012 | Park et al. | |
| 2013/0147555 A1 | 6/2013 | Liu et al. | |

FOREIGN PATENT DOCUMENTS

CN 106026997 A 10/2016

OTHER PUBLICATIONS

Aswinth Raj, Instrumentation Amplifier Circuit using Op-Amp, Dec. 17, 2020, Circuit Digest. (Year: 2020).*

* cited by examiner

*Primary Examiner* — Andrea Lindgren Baltzell
*Assistant Examiner* — Jose E Pinero
(74) *Attorney, Agent, or Firm* — Seed IP Law Group LLP

(57) ABSTRACT

A squelch detection device is provided. The squelch detection device receives first and second input signals and first and second threshold voltages. The squelch detection device determines a first common mode of the first and second input signals and a second common mode of the first and second threshold voltages. The squelch detection device averages the first common mode with the second common mode to produce an average common mode and sets the first common mode of the first and second input signals to the average common mode. The squelch detection device sets the second common mode of the first and second threshold voltages to the average common mode and determines a state of a squelch signal, indicative of whether the first and second input signals are attributable to noise, based on the first and second input signals and the first and second threshold voltages.

17 Claims, 5 Drawing Sheets

SQUELCH DETECTION DEVICE

BACKGROUND

Technical Field

This application is directed to a squelch detection device and, in particular, a squelch detection device that tolerates process variation low supply power and high input common mode variation.

Description of the Related Art

A squelch detector suppresses an output of a device, such as a receiver, in the absence of a sufficiently strong desired input signal. The squelch detector may be implemented as an amplitude envelope detector that differentiates between a valid signal and noise. In low power systems (for example, having a supply voltage of order of 0.9 to 1.1 volts (V), process variation and large input common mode range become increasingly dominant. As a result, it becomes increasingly difficult for a conventional squelch detector to differentiate between valid signal and noise. Also In presence of local and global process mismatch, achieving functionally of squelch becomes challenging.

BRIEF SUMMARY

A squelch detector that tolerates process variation and low-power environments is described herein. The squelch detector receives circuit-generated referential threshold voltages. The squelch detector compares input signals to the referential threshold voltages to distinguish between a valid signal and noise. The squelch detector outputs a squelch signal. The squelch signal is asserted or deasserted (set to a logical one or a logical zero) to indicate whether the input signal is valid or attributable to noise.

The squelch detector receives the referential threshold voltages and the input signals. The squelch detector averages the common mode of the static referential threshold voltages with the common mode of the input signals. The squelch detector then shifts (or forces) the common modes of the threshold voltages and input signals to the average. By shifting the common mode of the threshold voltages and input signals, the squelch detector is in effect adaptive and responsive to the operational conditions of the environment in which disclosure that is employed. The squelch detector moves the threshold voltages and track input signals behavior in step such that referential threshold voltage is dynamically adjusted based on environmental conditions impacted by input signals behavior.

DETAILED DESCRIPTION

A squelch detector may be used to suppress an output of a device in the absence of a sufficiently strong input signal. The squelch detector may be an amplitude envelope detector that differentiates between a valid signal and noise. In squelch detection, an input common mode signal is compared to a referential voltage (e.g., threshold voltage) to determine whether a voltage level of the input common mode signal exceeds the referential voltage. If the input signal is below the referential voltage, the signal may be attributable to noise or static. The signal level may be determined to be a logical zero. Conversely, if the voltage level is greater than the referential voltage, then the input signal may be deemed to have an ample level or may be deemed to be a logical one.

The referential voltage may be internally generated and may have a static or constant level. In a signaling environment having high noise, process variation or low supply voltage, a static referential threshold voltage is process-independent and not tolerant to variations in the common mode of the input signal.

To make the referential threshold voltage tolerant to variations in the common mode of the input signal, the common mode of the input signal and the referential threshold voltage are averaged (or shorted). Then, the threshold voltage changes in relation to the average of the common modes of the input signal and the referential threshold voltage.

Figure 1:
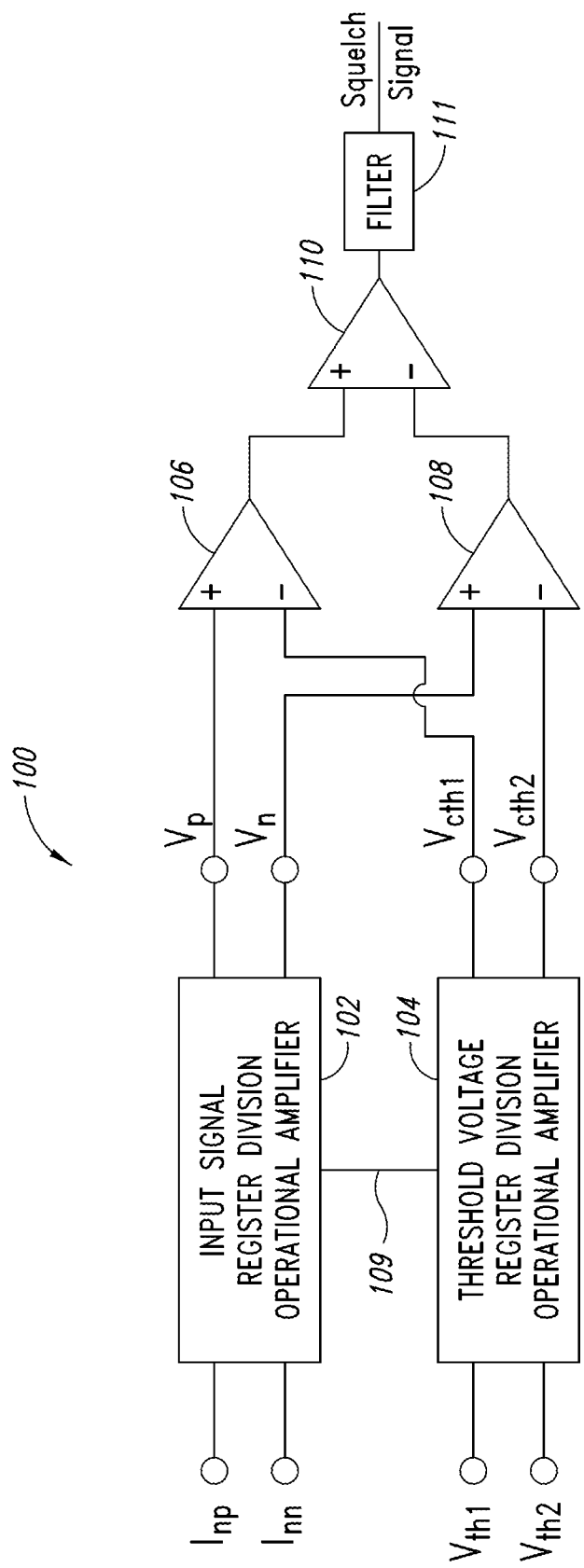
FIG. 1 shows a diagram of a squelch detection device.

FIG. 1 shows a diagram of a squelch detection device 100. The squelch detection device 100 includes an input signal register division operational amplifier 102, a threshold voltage register division operational amplifier 104 and a plurality of amplifiers including a first amplifier 106, a second amplifier 108, a third amplifier 110 and a filter 111. The input signal register division operational amplifier 102 and the threshold voltage register division operational amplifier 104 may each be a common mode feedback amplifier and may each have a current mirror load. The operational amplifiers 102, 104 also perform register-based division as described herein.

The input signal register division operational amplifier 102 has a first input for receiving a first input signal (Inp) and the second input for receiving a second input signal (Inn). The first and second input signals may be common mode signals. The input signal register division operational amplifier 102 has a first output for outputting a first compensated signal (Vp) and a second compensated signal (Vn). The input signal register division operational amplifier 102 has a control input for shorting or averaging a midpoint of the first and second compensated signals (Vp and Vn) with a midpoint of the compensated thresholds of the threshold voltage register division operational amplifier 104 described herein. The input signal register division operational amplifier 102 and the threshold voltage register division operational amplifier 104 are coupled to an average common mode voltage node 109. The average common mode voltage node 109 has a voltage level that is the average of the common mode of the first and second input signals (Inp and Inn) and first and second threshold voltages (Vth1 and Vth2).

The threshold voltage register division operational amplifier 104 has a first input for receiving the first threshold voltage (Vth1) and the second input for receiving the second threshold voltage (Vth2). The first and second threshold voltages may be common mode voltages. The threshold voltage register division operational amplifier 104 has a first output for outputting a first compensated threshold voltage (Vcth1) and a second compensated threshold voltage (Vcth2). The threshold voltage register division operational amplifier 104 has a control input for shorting or averaging a midpoint of the first and second compensated threshold voltages (Vcth1 and Vcth2) with the midpoint of the first and second compensated signals (Vp and Vn) of the input signal register division operational amplifier 102 described herein.

The first amplifier 106 has a first input, which may be a noninverting input, coupled to the first output of the input signal register division operational amplifier 102. The first amplifier 106 has a second input, which may be an inverting input, coupled to the first output of the threshold voltage register division operational amplifier 104. The first amplifier 106 receives the first compensated signal (Vp) and the first compensated threshold voltage (Vcth1). The first amplifier 106 compares the first compensated signal (Vp) and the first compensated threshold voltage (Vcth1) and outputs a signal based on the comparison. A voltage level of the output signal may be a function of the difference between the first compensated signal (Vp) and the first compensated threshold voltage (Vcth1).

The second amplifier 108 has a first input, which may be a noninverting input, coupled to the second output of the input signal register division operational amplifier 102. The second amplifier 108 has a second input, which may be an inverting input, coupled to the second output of the threshold voltage register division operational amplifier 104. The second amplifier 108 receives the second compensated signal (Vn) and the second compensated threshold voltage (Vcth2). The second amplifier 108 compares the second compensated signal (Vn) and the second compensated threshold voltage (Vcth2) and outputs a signal based on the comparison. A voltage level of the output signal may be a function of the difference between the second compensated signal (Vn) and the second compensated threshold voltage (Vcth2).

The first and second amplifiers 106, 108 each have respective outputs coupled to inputs of the third amplifier 110. The third amplifier 110 has an output for providing a squelch signal. The third amplifier 110 has a first input, which may be a noninverting input, coupled to the output of the first amplifier 106. The third amplifier 110 has a second input, which may be an inverting input, coupled to the output of the second amplifier 108. The third amplifier 110 compares the output of the first amplifier 106 to the output of the second amplifier 108. The Third amplifier 110 compares its differential inputs. The third amplifier 110 output toggles when the differential amplitude (vp, vn) envelope is greater than the referential threshold (vcth1, vcth2) envelope. The filter 111 converts toggled output to static flag (a logical one or to 'high') signal.

During operation, the input signal register division operational amplifier 102 receives the first and second input signals (Inp and Inn). The input signal register division operational amplifier 102 adjusts a common mode of the first and second input signals (Inp and Inn). In particular, the input signal register division operational amplifier 102 sets the common mode of the first and second input signals (Inp and Inn) to the average common mode of the input signals (Inp and Inn) and the threshold voltages (Vth1 and Vth2). The input signal register division operational amplifier 102 outputs the first and second compensated signals (Vp and Vn) having, as a common mode, the average common mode.

Similarly, the threshold voltage register division operational amplifier 104 receives the first and second threshold voltages (Vth1 and Vth2). The threshold voltage register division operational amplifier 104 adjusts a common mode of the first and second threshold voltages (Vth1 and Vth2). In particular, the threshold voltage register division operational amplifier 104 sets the common mode of the first and second threshold voltages (Vth1 and Vth2) to the average common mode of the input signals (Inp and Inn) and the threshold voltages (Vth1 and Vth2). The threshold voltage register division operational amplifier 104 outputs the first and second compensated threshold voltages (Vcth1 and Vcth2) having, as a common mode, the average common mode.

The first amplifier 106 receives the first compensated signal (Vp) and the first compensated threshold voltage (Vcth1) and compares the first compensated signal (Vp) and the first compensated threshold voltage (Vcth1). The first amplifier 106 outputs a first signal having a voltage level that is a function of the difference between the first compensated signal (Vp) and the first compensated threshold voltage (Vcth1). When the first compensated signal (Vp) is greater than the first compensated threshold voltage (Vcth1), the first signal has a positive voltage. When the first compensated signal (Vp) reaches the first compensated threshold voltage (Vcth1), the first signal has a zero voltage.

The second amplifier 108 receives the second compensated signal (Vn) and the second compensated threshold voltage (Vcth2) and compares the second compensated signal (Vn) and the second compensated threshold voltage (Vcth2). The second amplifier 108 outputs a second signal having a voltage level that is a function of the difference between the second compensated signal (Vn) and the second compensated threshold voltage (Vcth2). When the second compensated signal (Vn) is less than the second compensated threshold voltage (Vcth2), the second signal has a negative voltage. When the second compensated signal (Vn) reaches the second compensated threshold voltage (Vcth2), the second signal has a zero voltage.

The third amplifier 110 receives the first and second signals output by the first and second amplifiers 106, 108, respectively. The third amplifier 110 compares the first and second signals. The third amplifier 110 outputs a toggled squelch signal that is a function of the difference between the first and second signal. The squelch signal is asserted when a voltage level of the first signal is greater than a voltage level of the second signal. The squelch signal is deasserted when the first and second signals both have zero voltage levels or when conditions are reversed such that second signal has a positive voltage and the first signal has a negative voltage.

During operation, when the first compensated signal (Vp) is greater than the first compensated threshold voltage (Vcth1) and the second compensated signal (Vn) is less than the second compensated threshold voltage (Vcth2), the input signals (Inp and Inn) are have voltage levels that meet established thresholds and are said to be detectable. In this case, the first signal has a positive voltage and the second signal has a negative voltage. Consequently, the squelch signal is asserted.

Conversely, when the first compensated signal (Vp) is less than the first compensated threshold voltage (Vcth1) and the second compensated signal (Vn) is greater than the second compensated threshold voltage (Vcth2), the input signals (Inp and Inn) are have voltage levels that do not meet established thresholds and may be said to be undetectable or may be set to have undesirable voltage levels. In this case, the first signal has a negative voltage and the second signal has a positive voltage. Consequently, the squelch signal is deasserted.

Figure 2:
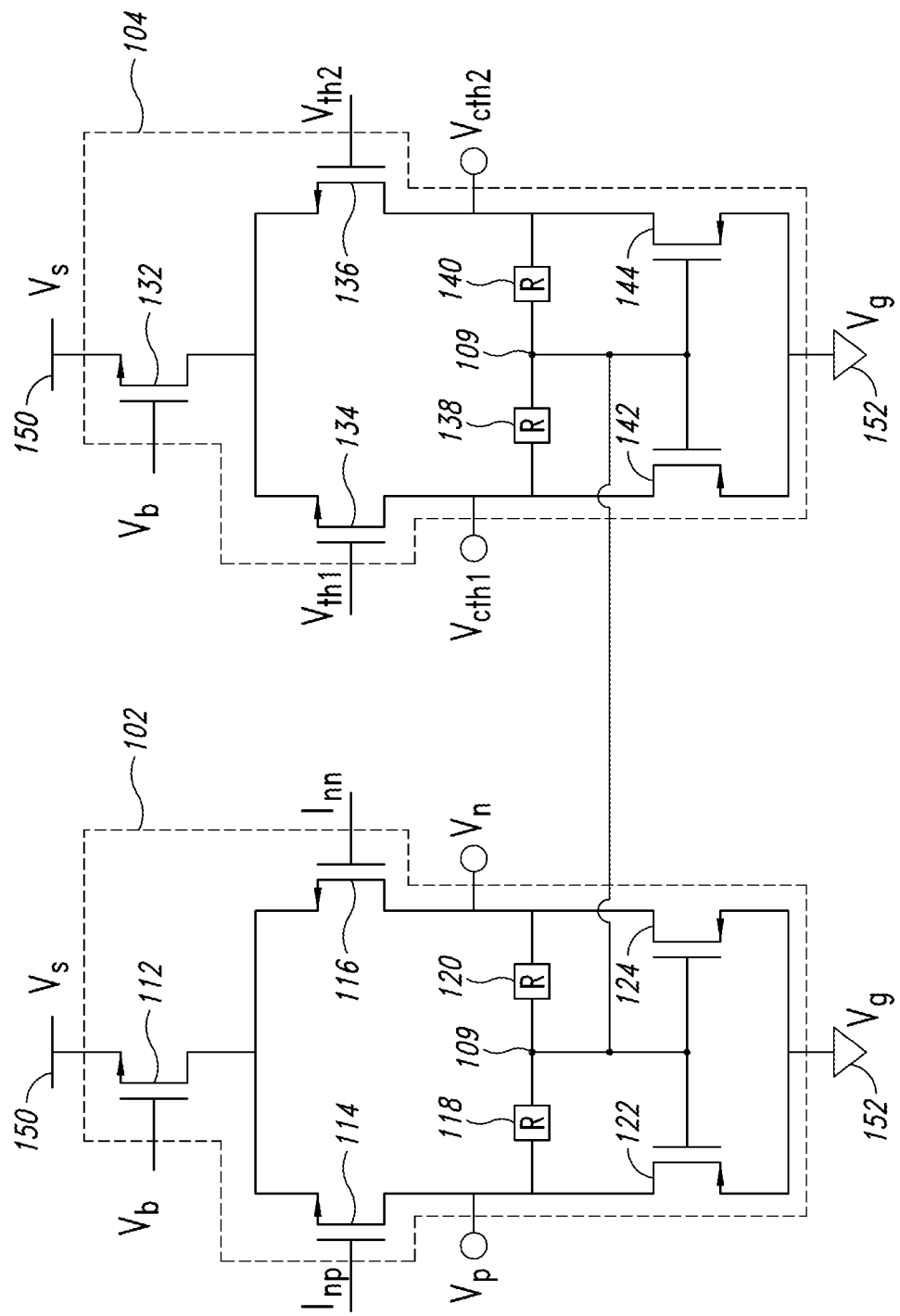
FIG. 2 shows a circuit diagram of the input signal and threshold voltage register division operational amplifiers of the squelch detection device.

FIG. 2 shows a circuit diagram of the input signal and threshold voltage register division operational amplifiers 102, 104. The input signal register division operational amplifier 102 includes a biasing transistor 112, first and second input transistors 114, 116, first and second registers 118, 120 and first and second load transistors 122, 124. The threshold voltage register division operational amplifier 104 includes a biasing transistor 132, first and second input transistors 134, 136, first and second registers 138, 140 and first and second load transistors 142, 144.

In the input signal register division operational amplifier 102, the biasing transistor 112 has a source coupled to a voltage source node 150, a gate for receiving a bias voltage and a drain coupled to both the source of the first input transistor 114 and the source of the second input transistor 116. The first input transistor 114 has a gate coupled to the first input of the operational amplifier 102. The gate receives the first input signal (Inp) over the first input. The first input transistor 114 has a drain coupled to the first output of the operational amplifier 102. The second input transistor 116 has a gate coupled to the second input of the operational amplifier 102. The gate receives the second input signal (Inn) over the second input. The second input transistor 116 has a drain coupled to the second output of the operational amplifier 102.

The first load transistor 122 has a drain coupled to the first output of the operational amplifier 102, a source coupled to a reference voltage node 152 and a gate coupled to an average common mode voltage node 109. The second load transistor 124 has a gate coupled to the average common mode voltage node 109, a drain coupled to the second output of the operational amplifier 102 and a source coupled to the reference voltage node 152. The first register 118 is coupled between the first output of the operational amplifier 102 and the average common mode voltage node 109. The second register 120 is coupled between the second output of the operational amplifier 102 and the average common mode voltage node 109.

In the threshold voltage register division operational amplifier 104, the biasing transistor 132 has a source coupled to the voltage source node 150, a gate for receiving the bias voltage (VB) and a drain coupled to both the source of the first input transistor 134 and the source of the second input transistor 136. The first input transistor 134 has a gate coupled to the first input of the operational amplifier 104. The gate receives the first threshold voltage (Vth1) over the first input. The first input transistor 124 has a drain coupled to the first output of the operational amplifier 104. The second input transistor 136 has a gate coupled to the second input of the operational amplifier 104. The gate receives the second threshold voltage (Vth2) over the second input. The second input transistor 136 has a drain coupled to the second output of the operational amplifier 104.

The first load transistor 142 has a drain coupled to the first input of the operational amplifier 104, a source coupled to the reference voltage node 152 and a gate coupled to the average common mode voltage node 109. The second load transistor 144 has a gate coupled to the average common mode voltage node 109, a drain coupled to the second output of the operational amplifier 104 and a source coupled to the reference voltage node 152. The first register 138 is coupled between the first output of the operational amplifier 104 and the average common mode voltage node 109. The second register 140 is coupled between the second output of the operational amplifier 104 and the average common mode voltage node 109. The input signal register division operational amplifier 102 and the threshold voltage register division operational amplifier 104 may advantageously be identical devices or be identically constructed.

When the first and second input signals (Inp and Inn) are applied to the gates of the first and second input transistors 114, 116, respectively, the voltage levels of the first and second input signals (Inp and Inn) are reflected as the first and second outputs of the operational amplifier 102. The registers 118, 120 average the voltage levels of the first and second input signals (Inp and Inn) and produce the common mode of the first and second input signals (Inp and Inn) at the average common mode voltage node 109. The common mode of the first and second input signals (Inp and Inn) is the average of the first and second input signals (Inp and Inn).

Similarly, the application of the first and second threshold voltages (Vth1 and Vth2) results in the common mode of the first and second threshold voltages (Vth1 and Vth2) being produced at the average common mode voltage node 109. Having received the common modes of the first and second input signals (Inp and Inn) and the first and second threshold voltages (Vth1 and Vth2), the average common mode voltage node 109 averages the two common modes.

Averaging the common modes of the input signals (Inp and Inn) and the threshold voltages (Vth1 and Vth2) and using the average common mode to drive the load transistors 122, 124, 142, 144 results in the compensated signals (Vp and Vn) and the second compensated threshold voltages (Vcth1 and Vcth2) having the same common mode voltage.

In the input signal register division operational amplifier 102, the average common mode voltage is used to drive the first and second load transistors 122, 124. Because the load transistors 122, 124 are driven by the average common mode voltage, the first and second compensated signals (Vp and Vn) taken from the respective drains of the load transistors 122, 124 have, as a common mode, the average common mode voltage. Similarly in the threshold voltage register division operational amplifier 104, the first and second compensated threshold voltages (Vcth1 and Vcth2) taken from the respective drains of the load transistors 142, 144 have, as a common mode, the average common mode voltage.

After forcing the common modes of the compensated signals (Vp and Vn) and the compensated threshold voltages (Vcth1 and Vcth2) to be the same, the compensated signals (Vp and Vn) and the compensated threshold voltages (Vcth1 and Vcth2) are compared to determine whether the squelch condition is met as described with reference to FIG. 1 herein.

Figure 3:
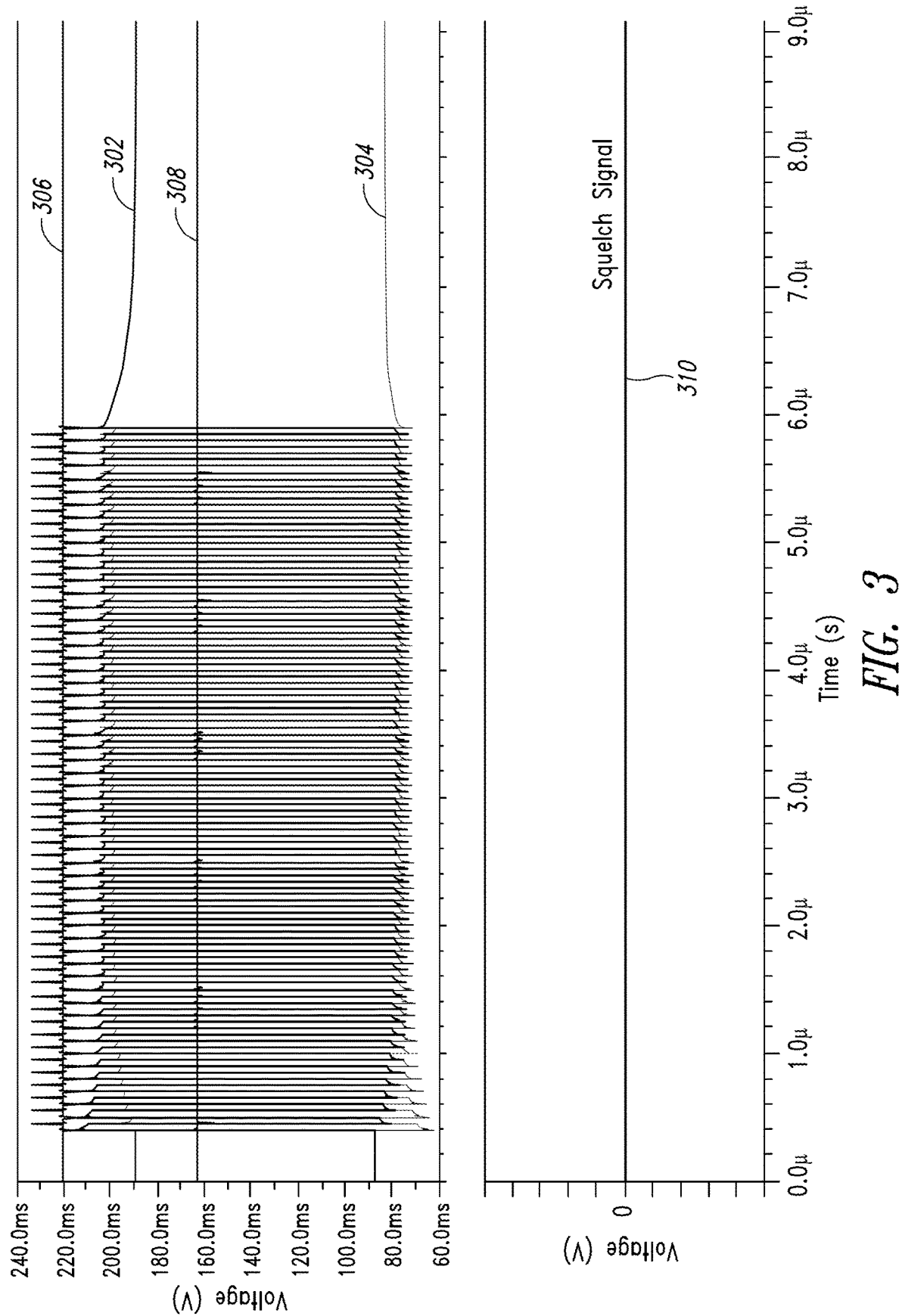
FIGS. 3 and 4 show signal diagrams of a conventional squelch detection device and the squelch detection device described with reference to FIG. 1, respectively.
Figure 4:
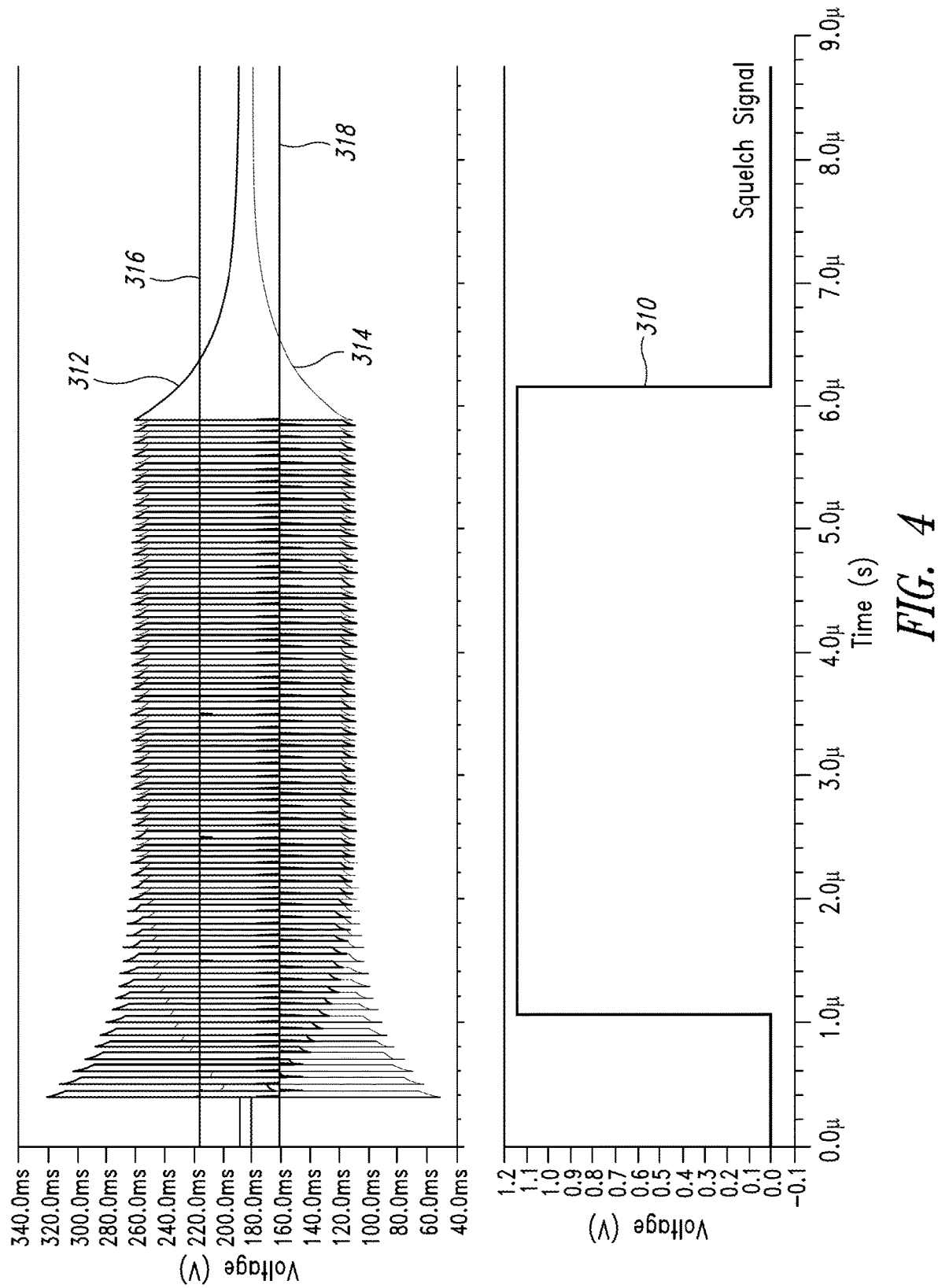

FIGS. 3 and 4 show signal diagrams of a conventional squelch detection device and the squelch detection device 100 described with reference to FIG. 1, respectively. The signal diagrams of FIG. 3 include a first input signal (Inp) 302, a second input signal (Inn) 304, a first threshold voltage (Vth1) 306, a second threshold voltage (Vth2) 308 and a squelch signal 310. In FIG. 3, the envelope of the first input signal (Inp) 302 is below the first threshold voltage (Vth1) 306, which has a voltage level of 220 millivolts (mV). The squelch signal 310 is continuously deasserted due to the fact that the first input signal (Inp) 302 (or envelope thereof) never exceeds the first threshold voltage (Vth1) 306.

The signal diagrams of FIG. 4 include a first compensated input signal (Vp) 312, a second compensated input signal (Vn) 314, a first compensated threshold voltage (Vcth1) 316, a second compensated threshold voltage (Vcth2) 318 and the squelch signal 310. The common mode of the first and second compensated input signals (Vp and Vn) 312, 314 is set to or forced to the average of the common mode of the first and second compensated threshold voltages (Vcth1 and Vcth2) 316, 318 with the common mode of the first and second compensated input signals (Vp and Vn) 312, 314. Accordingly, the envelope of the first and second compensated input signals (Vp and Vn) 312, 314 surrounds the first and second compensated threshold voltages (Vcth1 and Vcth2) 316, 318 for the duration of operation between about 1 microseconds (µs) to 6 µs. The squelch signal 310 is asserted indicating a sufficient voltage level of the input signals in comparison with the threshold voltages. The squelch signal is again deasserted after about 6 µs indicating that the voltage level of the input signals is below the desired threshold voltage.

Setting the common mode of the first and second compensated input signals (Vp and Vn) to the average of the common mode may include increasing or decreasing a voltage level of the first and second input signals (Inp and Inn) by the difference between the average common mode and the common mode of the first and second input signals (Inp and Inn). For example, if the difference between the average common mode and the common mode of the first and second input signals (Inp and Inn) is positive (i.e., the average common mode is greater than the common mode of the first and second input signals (Inp and Inn)), the voltage level of both the first and second input signals (Inp and Inn) is increased by the difference to produce the first and second compensated input signals (Vp and Vn). Conversely, if the difference between the average common mode and the common mode of the first and second input signals (Inp and Inn) is negative (i.e, the common mode of the first and second input signals (Inp and Inn) is greater than the average common mode), the voltage level of both the first and second input signal is decreased by the difference to produce the first and second compensated input signals (Vp and Vn). The first and second compensated input signals (Vp and Vn) are copies or replicas of the first and second input signals (Inp and Inn) having their voltage levels or amplitudes adjusted to force their common mode to the average common mode. Similarly, the first and second compensated threshold voltages (Vcth1 and Vcth2) may be produces from the first and second threshold voltages (Vth1 and Vth2).

In an embodiment, a device, including a receiver, such as a universal serial bus (USB) receiver, may receive the squelch signal. The device may use the squelch signal to determine whether to process the first and second input signals (Inp and Inn). The squelch signal, when deasserted or set to a first state, may cause the device operation to be suppressed. When the squelch signal is deasserted or set to the first state, the device may cease processing the first and second input signals (Inp and Inn) due to the fact that the first and second input signals (Inp and Inn) are determined to be attributed to noise or determined to be insufficiently strong to include data or be reliably processed. When the squelch signal is asserted or set to a second state different from the first state, the device may process the first and second input signals (Inp and Inn).

Figure 5:
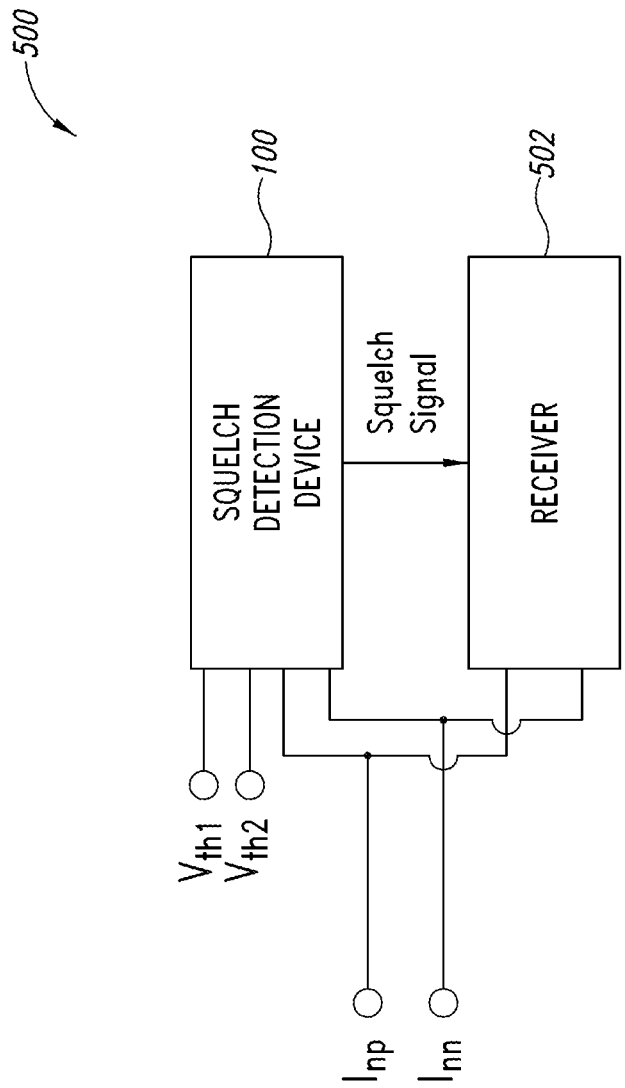
FIG. 5 shows a block diagram of a system including the squelch detection device and a receiver.

FIG. 5 shows a block diagram of a system 500 including the squelch detection device 100 and a receiver 502. The squelch detection device 100 receives the first and second input signals (Inp and Inn) and the first and second threshold voltages (Vth1 and Vth2) and outputs a squelch signal as described herein. The receiver 502, which may be a USB receiver, among others, receives the first and second input signals (Inp and Inn) and the squelch signal generated by the squelch detection device 100.

A state of the squelch signal indicates to the receiver whether a level (for example, voltage level) of the first and second input signals (Inp and Inn) meets a criterion. The state of the squelch signal may indicate to the receiver 502 whether the first and second input signals (Inp and Inn) are attributable to noise or whether they may be reliably received. For example, if the squelch signal has a first state, the receiver 502 may cease processing the first and second input signals (Inp and Inn) due to the fact that the first and second input signals (Inp and Inn) are determined to be attributed to noise or determined to be insufficiently strong to include data or be reliably processed. When the squelch signal is asserted or set to a second state different from the first state, the receiver 502 may process the first and second input signals (Inp and Inn).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
  a first amplifier configured to:
    receive first and second input signals having a first common mode; and
    generate first and second compensated signals from the first and second input signals, respectively, by changing the first common mode to a second common mode that is an average of the first common mode and a third common mode of first and second pre-compensated threshold voltages;
  one or more second amplifiers; and
  a third amplifier configured to generate first and second compensated threshold voltages from the first and second pre-compensation threshold voltages,
  wherein the one or more second amplifiers are configured to:
    receive the first and second compensated signals and first and second compensated threshold voltages; and
    output a squelch signal based on the first and second compensated signals and the first and second compensated threshold voltages.

2. The device of claim 1, wherein:
  the third amplifier is configured to:
    receive the first and second pre-compensation threshold voltages having the third common mode; and
    generate the first and second compensated threshold voltages from the first and second pre-compensation threshold voltages, respectively, by changing the third common mode to the second common mode.

3. The device of claim 1, wherein the one or more second amplifiers are configured to:
  compare the first compensated signal with the first compensated threshold voltage; and
  compare the second compensated signal with the second compensated threshold voltage.

4. The device of claim 3, wherein the one or more second amplifiers are configured to:
  set the squelch signal to a first state in response to the first compensated signal exceeding the first compensated threshold voltage and the second compensated signal being below the second compensated threshold voltage.

5. The device of claim 3, wherein the one or more second amplifiers are configured to:
  set the squelch signal to a second state in response to the first compensated signal not exceeding the first compensated threshold voltage and the second compensated signal exceeding the second compensated threshold voltage.

6. The device of claim 2, wherein:
the first amplifier is configured to set the first common mode of the first and second input signals to the second common mode by increasing or decreasing a first voltage level of the first input signal by a difference between the second common mode and the first common mode and increasing or decreasing a second voltage level of the second input signal by the difference between the second common mode and the first common mode; and
the third amplifier is configured to set the third common mode of the first and second pre-compensation threshold voltages to the second common mode by increasing or decreasing a third voltage level of the first pre-compensation threshold voltage by a difference between the second common mode and the third common mode and increasing or decreasing a fourth voltage level of the second pre-compensation threshold voltage by the difference between the second common mode and the third common mode.

7. A method, comprising:
receiving, by a first amplifier, first and second input signals having a first common mode;
generating, by the first amplifier, first and second compensated signals from the first and second input signals, respectively, by changing the first common mode to a second common mode that is an average of the first common mode and a third common mode of first and second pre-compensated threshold voltages;
generating, by a third amplifier configured, the first and second compensated threshold voltages from the first and second pre-compensation threshold voltages;
receiving, by one or more second amplifiers, the first and second compensated signals and first and second compensated threshold voltages; and
outputting, by the one or more second amplifiers, a squelch signal based on the first and second compensated signals and the first and second compensated threshold voltages.

8. The method of claim 7, comprising:
receiving, by the third amplifier, the first and second pre-compensation threshold voltages having the third common mode; and
generating, by the third amplifier, the first and second compensated threshold voltages from the first and second pre-compensation threshold voltages, respectively, by changing the third common mode to the second common mode.

9. The method of claim 7, comprising:
comparing, by the one or more second amplifiers, the first compensated signal with the first compensated threshold voltage; and
comparing, by the one or more second amplifiers, the second compensated signal with the second compensated threshold voltage.

10. The method of claim 9, comprising:
setting, by the one or more second amplifiers, the squelch signal to a first state in response to the first compensated signal exceeding the first compensated threshold voltage and the second compensated signal being below the second compensated threshold voltage.

11. The method of claim 9, comprising:
setting, by the one or more second amplifiers, the squelch signal to a second state in response to the first compensated signal not exceeding the first compensated threshold voltage and the second compensated signal exceeding the second compensated threshold voltage.

12. The method of claim 8, wherein:
setting the first common mode of the first and second input signals to the second common mode includes:
increasing or decreasing a first voltage level of the first input signal by a difference between the second common mode and the first common mode; and
increasing or decreasing a second voltage level of the second input signal by the difference between the second common mode and the first common mode; and
setting the third common mode of the first and second pre-compensation threshold voltages to the second common mode includes:
increasing or decreasing a third voltage level of the first pre-compensation threshold voltage by a difference between the second common mode and the third common mode; and
increasing or decreasing a fourth voltage level of the second pre-compensation threshold voltage by the difference between the second common mode and the third common mode.

13. A system, comprising:
a squelch detection device including:
a first amplifier configured to:
receive first and second input signals having a first common mode; and
generate first and second compensated signals from the first and second input signals, respectively, by changing the first common mode to a second common mode that is an average of the first common mode and a third common mode of first and second pre-compensated threshold voltages;
one or more second amplifiers; and
a third amplifier configured to generate first and second compensated threshold voltages from the first and second pre-compensation threshold voltages,
wherein the one or more second amplifiers are configured to:
receive the first and second compensated signals and first and second compensated threshold voltages; and
output a squelch signal based on the first and second compensated signals and the first and second compensated threshold voltages; and
a receiver configured to receive the squelch signal and the first and second input signals and suppress processing of the first and second input signals based on the squelch signal.

14. The system of claim 13, wherein:
the third amplifier is configured to:
receive the first and second pre-compensation threshold voltages having the third common mode; and
generate the first and second compensated threshold voltages from the first and second pre-compensation threshold voltages, respectively, by changing the third common mode to the second common mode.

15. The system of claim 13, wherein the one or more second amplifiers are configured to:
compare the first compensated signal with the first compensated threshold voltage; and
compare the second compensated signal with the second compensated threshold voltage.

16. The system of claim 15, wherein the one or more second amplifiers are configured to:
set the squelch signal to a first state in response to the first compensated signal exceeding the first compensated threshold voltage and the second compensated signal being below the second compensated threshold voltage.

17. The system of claim 15, wherein the one or more second amplifiers are configured to:
   set the squelch signal to a second state in response to the first compensated signal not exceeding the first threshold voltage and the second compensated signal exceeding the second threshold voltage.

* * * * *